(12) United States Patent
Gammel et al.

(10) Patent No.: US 7,279,744 B2
(45) Date of Patent: Oct. 9, 2007

(54) CONTROL OF HOT CARRIER INJECTION IN A METAL-OXIDE SEMICONDUCTOR DEVICE

(75) Inventors: Peter L. Gammel, Millburn, NJ (US); Isik C. Kizilyalli, Allentown, PA (US); Marco G. Mastrapasqua, Annandale, NJ (US); Muhammed Ayman Shibib, Wyomissing, PA (US); Zhijian Xie, Oak Ridge, NC (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 55 days.

(21) Appl. No.: 10/977,732

(22) Filed: Oct. 29, 2004

(65) Prior Publication Data

US 2005/0156234 A1 Jul. 21, 2005

Related U.S. Application Data

(60) Provisional application No. 60/520,265, filed on Nov. 14, 2003.

(51) Int. Cl.
*H01L 29/76* (2006.01)
(52) U.S. Cl. .............................. 257/335; 257/E29.112
(58) Field of Classification Search ................ 257/335, 257/341; 438/268, 301
See application file for complete search history.

(56) References Cited

U.S. PATENT DOCUMENTS 6,614,089 B2 * 9/2003 Nakamura et al. .......... 257/492
2005/0191815 A1 * 9/2005 Shibib et al. ............... 438/303

OTHER PUBLICATIONS

S. Manzini et al., "Hot-Electron-Induced Degradation in High-Voltage Submicron DMOS Transistors," Proc. IEEE ISPSD, pp. 65-68, 1996.
D. Brisbin et al., "Hot Carrier Reliability of N-LDMOS Transistor Arrays for Power BiCMOS Applications," Proc. IEEE IRPS, pp. 105-110, 2002.
P. Moens et al., "A Unified Hot Carrier Degradation Model for Integrated Lateral and Vertical nDMOS Transistors," Proc. IEEE ISPSD, pp. 88-91, 2003.
S. Xu et al., "High Power Silicon RF LDMOSFET Technology for 2.1GHz Power Amplifier Applications," Proc. IEEE ISPSD, pp. 190-193, 2003.
T. Nigam et al., "Nature and Location of Interface Traps in RF LDMOS due to Hot Carriers," INFOS, Barcelona, Spain, 4 pages, 2003.

* cited by examiner

*Primary Examiner*—Richard A. Booth

(57) ABSTRACT

An MOS device is formed including a semiconductor layer of a first conductivity type, and first and second source/drain regions of a second conductivity type formed in the semiconductor layer proximate an upper surface of the semiconductor layer, the first and second source/drain regions being spaced apart relative to one another. A drift region is formed in the semiconductor layer proximate the upper surface of the semiconductor layer and at least partially between the first and second source/drain regions. An insulating layer is formed on at least a portion of the upper surface of the semiconductor layer and above at least a portion of the drift region. A gate is formed on the insulating layer and at least partially between the first and second source/drain regions. The MOS device further includes a shielding structure formed on the insulating layer above at least a portion of the drift region. The shielding structure is configured such that an amount of hot carrier injection degradation in the MOS device is controlled as a function of an amount of coverage of the shielding structure over an upper surface of the drift region.

16 Claims, 3 Drawing Sheets

PEAK SUBSTRATE CURRENT (e-05) vs % FIELD PLATE COVERAGE OF THE DRIFT REGION

RON DEGRADATION vs % FIELD PLATE COVERAGE OF DRIFT REGION

RON DEGRADATION vs PEAK SUBSTRATE CURRENT

TF (SECOND AT 1% DEGRADATION)

CONTROL OF HOT CARRIER INJECTION IN A METAL-OXIDE SEMICONDUCTOR DEVICE

CROSS-REFERENCE TO RELATED APPLICATIONS

This application claims the benefit of U.S. Provisional Application Ser. No. 60/520,265 filed on Nov. 14, 2003, the disclosure of which is incorporated by reference herein.

FIELD OF THE INVENTION

The present invention relates generally to semiconductor devices, and more particularly relates to techniques for controlling hot carrier injection (HCI) degradation in a metal-oxide semiconductor (MOS) device.

BACKGROUND OF THE INVENTION

Power MOS devices, including lateral diffused MOS (LDMOS) devices, are employed in a wide variety of applications, such as, for example, power amplifiers in wireless communications systems. HCI degradation can significantly limit the performance of these devices, particularly when operating in a saturation region. As is well known, the HCI phenomenon generally results from heating and subsequent injection of charge carriers into the gate oxide and/or an oxide layer above a drift region of an LDMOS device. This injection of charge carriers often results in a localized and nonuniform buildup of interface states and oxide charges near and underneath a gate and/or in the drift region of the device. It has been shown that, over time, several electrical characteristics of the LDMOS device degrade as a direct result of HCI (see, e.g., S. Manzini et al., "Hot-Electron-Induced Degradation in High-Voltage Submicron DMOS Transistors," *Proc. IEEE ISPSD*, pp. 65-68, 1996, which is incorporated by reference herein). For example, HCI can produce variations in certain characteristics of the LDMOS device, including saturation current, threshold voltage, transconductance, on-resistance, etc., thus undesirably affecting the performance and reliability of the device.

Studies of LDMOS HCI degradation demonstrate a significant increase in on-resistance without a significant change in a threshold voltage of the device as a result of HCI (see, e.g., D. Brisbin, et al., "Hot Carrier Reliability of N-LDMOS Transistor Arrays for Power BiCMOS Applications," *Proc. IEEE IRPS*, pp. 105-110, 2002, and P. Moens, et al., "A Unified Hot Carrier Degradation Model for Integrated Lateral and Vertical nDMOS Transistors," *Proc. IEEE ISPSD*, pp. 88-91, 2003, which are incorporated by reference herein). This is more typical for an LDMOS device since the threshold voltage is determined primarily by the peak concentration of doping in a channel region of the device, close to a source region of the device. Saturation current generally decreases in the LDMOS device as a result of HCI.

A conventional LDMOS device typically includes a lightly-doped drain (LDD) region which is often formed at or near an upper surface interface between the silicon and oxide of the device. Locating the LDD region in close relative proximity to the silicon/oxide interface, however, significantly increases the likelihood that charged carriers will become trapped at the interface, thereby increasing HCI degradation in the device. The amount of HCI degradation in the device can be measured as a function of the amount of increase in the on-resistance of the device (on-resistance degradation) and/or the amount of decrease in the saturation current (saturation current degradation) in the device.

In many applications, such as, for example, power applications, it is desirable to minimize the on-resistance associated with the device. In an LDMOS device, since the on-resistance is dominated primarily by the characteristics of the LDD region, one known methodology for reducing the on-resistance is to increase a doping concentration of the LDD region. However, since the LDD region is typically formed at the silicon/oxide interface of the device, as previously stated, increasing the doping concentration of the LDD region also undesirably increases HCI degradation in the device. The increase in HCI degradation resulting from the increased doping concentration of the LDD region often significantly undermines any beneficial reduction in on-resistance that may otherwise be achieved by increasing the doping concentration of the LDD region. Furthermore, by increasing the doping concentration of the LDD region in the device, a breakdown voltage of the device is undesirably reduced.

There exists a need, therefore, for an improved MOS device capable of controlling HCI degradation, that does not suffer from one or more of the problems exhibited by conventional MOS devices. Moreover, it would be desirable if the improved MOS device were compatible with existing integrated circuit (IC) fabrication process technologies.

SUMMARY OF THE INVENTION

The present invention meets the above-noted need by providing techniques for beneficially reducing HCI degradation in an MOS device. In accordance with an illustrative embodiment of the invention, an LDMOS is formed having a dummy gate field plate structure which is configured to control an amount of HCI degradation based, at least in part, on an amount of coverage of the dummy gate field plate over a drift region in the device. Moreover, the techniques of the present invention can be used to fabricate an integrated circuit including, for example, an LDMOS device, using conventional MOS compatible process technology. Consequently, the cost of manufacturing the integrated circuit is not significantly increased.

In accordance with one aspect of the invention, an MOS device is formed including a semiconductor layer of a first conductivity type, and first and second source/drain regions of a second conductivity type formed in the semiconductor layer proximate an upper surface of the semiconductor layer, the first and second source/drain regions being spaced apart relative to one another. A drift region is formed in the semiconductor layer proximate the upper surface of the semiconductor layer and at least partially between the first and second source/drain regions. An insulating layer is formed on at least a portion of the upper surface of the semiconductor layer and above at least a portion of the drift region. A gate is formed on the insulating layer and at least partially between the first and second source/drain regions. The MOS device further includes a shielding structure formed on the insulating layer above at least a portion of the drift region. The shielding structure is configured such that an amount of hot carrier injection degradation in the MOS device is controlled as a function of an amount of coverage of the shielding structure over an upper surface of the drift region.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative complementary MOS (CMOS) IC fabrication technology suitable for forming discrete LDMOS transistors, as well as circuits and/or other devices. It should be appreciated, however, that the present invention is not limited to the fabrication of this or any particular circuit or other device. Rather, the invention is more generally applicable to an MOS device comprising a shielding structure which is advantageously configured to control an amount of HCI degradation in the device, without significantly impacting breakdown voltage in the device. Moreover, the shielding structure is fully compatible with a CMOS process technology.

Although implementations of the present invention are described herein with specific reference to an LDMOS device, it is to be appreciated that the techniques of the present invention are similarly applicable to other devices, as will be understood by those skilled in the art. Furthermore, although the invention will be described herein in the context of an N-channel MOS device, it is to be understood by those skilled in the art that a P-channel MOS device could be similarly formed by substituting opposite polarities to those given for the N-channel embodiment, in at least the active regions of the device, and that the techniques and advantages of the present invention will also apply to the alternative embodiment.

It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layers not explicitly shown are omitted in the actual IC device.

Figure 1:
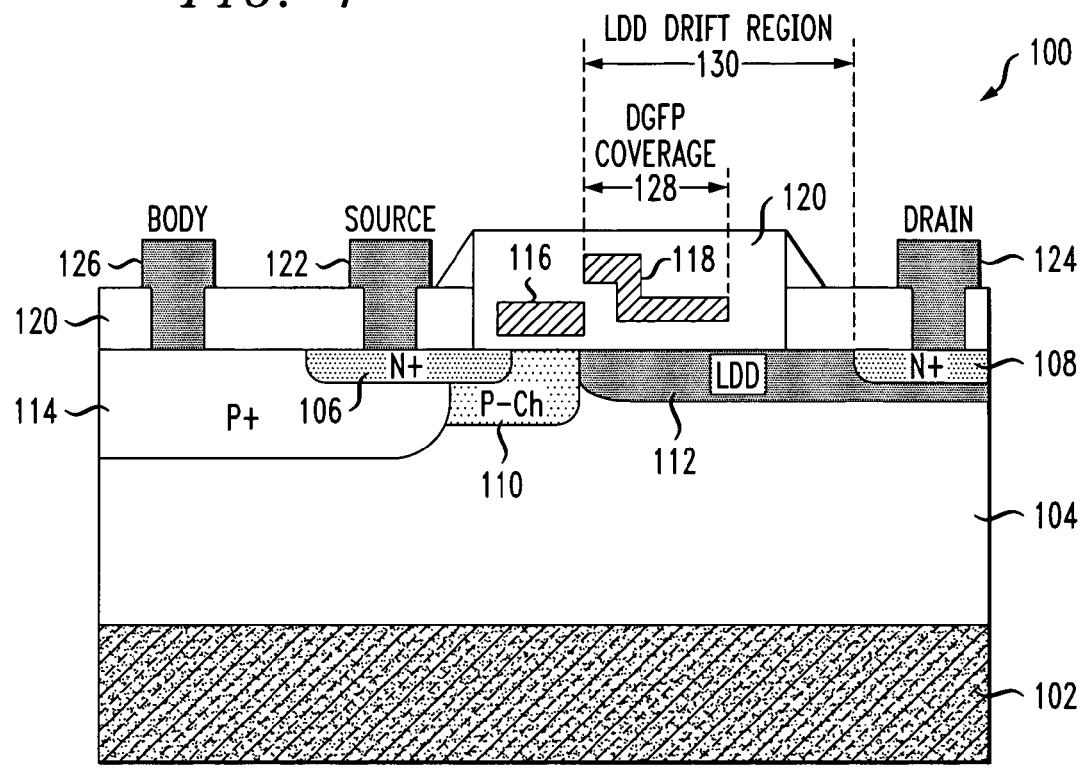
FIG. 1 is a cross-sectional view depicting at least a portion of a semiconductor wafer including an exemplary LDMOS device in which the techniques of the present invention are implemented.

FIG. 1 illustrates a cross-sectional view of at least a portion of a semiconductor wafer comprising an exemplary LDMOS device 100 in which the techniques of the present invention are implemented. The LDMOS device 100 includes a semiconductor substrate 102. The substrate 102 is commonly formed of single-crystal silicon (e.g., having a <100> or <111> crystal orientation), although suitable alternative materials may also be used, such as, but not limited to, germanium, gallium arsenide, gallium nitride etc. Additionally, the substrate is preferably modified by adding an impurity or dopant to change the conductivity of the material (e.g., N-type or P-type). In a preferred embodiment of the invention, the substrate 102 is of P-type conductivity and may thus be referred to as a P+ substrate. A P+ substrate may be formed by adding a P-type impurity or dopant (e.g., boron) of a known concentration level (e.g., about $5 \times 10^{18}$ to about $5 \times 10^{19}$ atoms per cubic centimeter) to the substrate material, such as by a diffusion or implant step, to change the conductivity of the material as desired.

An epitaxial layer 104 may be formed on at least a portion of the substrate 102. By introducing selected types of impurities (e.g., boron, phosphorous, arsenic, etc.) into the epitaxial layer 104, a resistivity of the epitaxial layer can be modified as desired. The thickness of the epitaxial layer is typically less than about 10 micrometers (μm), although the present invention is not limited to any particular thickness of the epitaxial layer. In a preferred embodiment of the invention, the epitaxial layer 104 is doped with a P-type impurity (e.g., boron). The doping concentration of the epitaxial layer 104 is preferably lower (e.g., about $10^{15}$ to about $10^{16}$ atoms per cubic centimeter) in comparison to the doping concentration of the substrate 102, and may therefore be referred to as a P− epitaxial layer.

The term "semiconductor layer" as may be used herein refers to any semiconductor material upon which and/or in which other materials may be formed. The semiconductor layer may comprise a single layer, such as, for example, substrate 102, or it may comprise multiple layers, such as, for example, the substrate and epitaxial layer 104. The semiconductor wafer comprises the substrate 102, with or without the epitaxial layer 104, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a semiconductor structure may be formed.

The exemplary LDMOS device 100 further includes a source region 106 and a drain region 108 formed in the epitaxial layer 104, proximate an upper surface of the epitaxial layer, such as by a conventional implant and diffusion process. The source and drain regions are preferably doped, such as by a conventional implant step, with an impurity of a known concentration level to selectively change the conductivity of the material as desired. Preferably, the source and drain regions 106, 108 have a conductivity type associated therewith which is opposite a conductivity type of the substrate 102, so that active regions can be formed in the device. In a preferred embodiment of the invention, the source and drain regions 106, 108 are of N-type conductivity.

The LDMOS device 100 preferably includes a drain contact 124, electrically connected to the drain region 108, and a source contact 122, electrically connected to the source region 106. A P+ body region 114 associated with the source region 106 may be formed adjacent to and at least partially below the source region. Electrical connection to the source region 106 may alternatively be made by way of a substrate contact (not shown). In this instance, electrical connection between the source region 106 and the substrate 102 may be provided by forming one or more trench sinkers (not shown) through the epitaxial layer 104. The trench sinkers may be formed in a conventional manner, such as, for example, by opening windows in the epitaxial layer 104 (e.g., by photolithographic patterning and etching) to expose the substrate 102, and filling the trenches with a conductive material, as will be understood by those skilled in the art. For purposes of experimentation, a body (bulk) contact 126 is preferably provided which is electrically connected to the body region 114. With access to the body contact, certain characteristics of the device, such as, for example, substrate current (often referred to as body current, which is used interchangeably with the term substrate current), can be more easily measured. An oxide layer 120 (e.g., silicon dioxide), or alternative insulating layer, is generally formed on at least a portion of the upper surface of the epitaxial layer 104 to electrically isolate the source and drain contacts of the device as well as to protect the device.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

A channel region 110 and a drift region, which may comprise an LDD region 112, are formed in the LDMOS device 100. Although shown as comprising a single LDD region 112, it is to be appreciated that the drift region may similarly comprise two or more LDD regions. Moreover, assuming more than one LDD region is employed, the respective doping concentrations of each of the LDD regions need not be the same relative to one another, but instead may be individually adjusted to control one or more characteristics of the drift region (e.g., electric field distribution) as desired. The channel region 110 is formed proximate the upper surface of the epitaxial layer 104 and adjacent to the source region 106. At least a portion of the channel region 110 may be formed under the source region 106. The LDD region 112 is formed proximate the upper surface of the epitaxial layer 104 and extends substantially horizontally, defined as being in a plane substantially parallel to the substrate 102, between the channel region 110 and the drain region 108. At least a portion of the LDD region 112 may be formed under the drain region 108. The channel region 110 may be formed of a material having the same conductivity type as the substrate, preferably P-type. The LDD region 112 may be formed of a material having the same conductivity type as the source and drain regions, preferably N-type, although the relative doping concentration of the LDD region compared to the source and drain regions is typically lower.

The exemplary LDMOS device 100 further includes a gate 116 formed above at least a portion of the channel region 110 and proximate the upper surface of the epitaxial layer 104. The gate may be formed of, for example, polysilicon material, although alternative suitable materials (e.g., metal) may be similarly employed. The gate 116 is electrically isolated from the channel region 110 by at least a portion of the oxide layer 120 formed under the gate. The portion of the oxide layer 120 under the gate 116 is often referred to as gate oxide. While the thickness of the gate oxide is preferably about 200 nanometers (nm), the present invention is not limited to a particular gate oxide thickness. Due at least in part to the relatively high electric field concentration near the edges of the gate 116 and the close relative proximity of the gate to an interface between the upper surface of the silicon epitaxial layer 104 and the oxide layer 120, HCI often occurs at the silicon/oxide interface near the LDD region 112 immediately proximate an edge of the gate 116.

In order to reduce HCI degradation in the LDMOS device 100, a dummy gate field plate (DGFP) 118, or an alternative shielding structure, is formed on oxide layer 120, between the gate 116 and the drain region 108. The DGFP 118 is preferably formed in close relative proximity to the upper surface of the epitaxial layer 104, above at least a portion of the LDD region 112 of the LDMOS device 100. The DGFP 118 is electrically isolated from the gate 116 by the oxide layer 120 formed on the upper surface of the device 100. Moreover, the thickness of the portion of the oxide layer 120 under the DGFP 118 may be substantially the same as the gate oxide thickness (e.g., about 30 nm to about 300 nm), although a thinner or thicker oxide thickness may be employed. The reduction in HCI degradation in the LDMOS device 100 may be affected to some extent by the thickness of the oxide layer 120 under the DGFP 118. It is to be understood that the DGFP 118 is different from a source-extended field plate, often referred to as a Faraday shield. For example, the oxide thickness under the DGFP is preferably closer to the gate oxide thickness than it is to a field oxide thickness (FOX), as in the case of the Faraday shield.

The DGFP 118 may overlap at least an edge of the gate 116 at a first end, as shown, although the DGFP may alternatively be configured in a substantially non-overlapping arrangement relative to the gate. The amount of overlap of the DGFP 118 above the gate 116 is preferably minimized in order to reduce a gate-to-source capacitance (Cgs) associated with the LDMOS device 100. A second end of the DGFP 118 is preferably formed above at least a portion of the LDD region 112 as the DGFP extends substantially horizontally from the edge of the gate 116 towards the drain region 108. The DGFP 118, like the gate 116, preferably comprises polysilicon, although suitable alternative materials (e.g., metal) may also be utilized.

The DGFP 118 in the exemplary LDMOS device 100 is preferably electrically connected (e.g., strapped) to the source region 106 using, for example, one or more conductive traces, contact vias and/or conductive plugs (not shown). The conductive trace(s) and contact vias may be formed using a high level metalization process (e.g., second or higher level metal), while the conductive plug, which provides an electrical connection between the source region 106 and one of the contact vias, may be formed during the same process step used to form the DGFP 118. The electrical connection between the DGFP 118 and the source region 106 is preferably spaced far enough from the gate 116 so that the gate-to-source capacitance is not significantly increased. In a preferred embodiment of the invention, the electrical connection bridging the DGFP 118 to the source region 106 is spaced about one micron from the gate 116. Alternative methods for forming the electrical connection between the DGFP 118 and the source region 106 are similarly contemplated by the present invention.

The shape of the DGFP 118 can affect a distribution of equipotential lines, and thus an electric field distribution, in the LDMOS device 100. Thus, by controlling the shape of the DGFP 118, the electric field in at least the drift region of the LDMOS device can be more uniformly distributed so as to reduce HCI degradation. Additionally, in accordance with an important aspect of the invention, the degradation of the on-resistance and/or saturation current as a result of HCI in the LDMOS device 100 is beneficially controlled as a function of the amount of overlap of the DGFP 118 over the LDD region 112. The amount of overlap of the DGFP 118 over the LDD region 112 may be expressed as a percentage of DGFP coverage 128 of a specified portion of the LDD drift region 130. It is to be understood that the present invention is not limited to the particular shape and/or size of the DGFP 118 shown.

As will be described in further detail below, HCI degradation in the LDMOS device 100 decreases as the DGFP coverage 128 of the LDD drift region 130 increases. However, the breakdown voltage of the device also undesirably decreases as the percentage of DGFP coverage increases. Therefore, the DGFP coverage of the LDD drift region is preferably selected to be as large as possible while still maintaining a desired minimum breakdown voltage for the device. In a preferred embodiment of the invention, the DGFP coverage 128 in the LDD drift region 130 of the LDMOS device 100 is chosen to be about 40 percent (%), while maintaining a breakdown voltage above about 75 volts in the device.

By way of example only, and without loss of generality, several exemplary LDMOS devices were fabricated, each of the devices being essentially identical except for the amount of DGFP coverage of their respective LDD drift regions. For example, one device was formed having no DGFP coverage (zero percent), and the other devices were formed having DGFP coverages of 13%, 20%, 27%, 33% and 40% of their respective drift regions. All of the devices maintained a breakdown voltage above about 75 volts. All of the devices were stressed at a drain current, Ids, of 5 milliamperes (mA) and a drain-to-source voltage, Vds, of 28 volts, and at a temperature of 25 degrees Celsius. FIGS. 2-6 are graphical representations illustrating certain experimental electrical performance measurements corresponding to the exemplary LDMOS devices.

Figure 2:
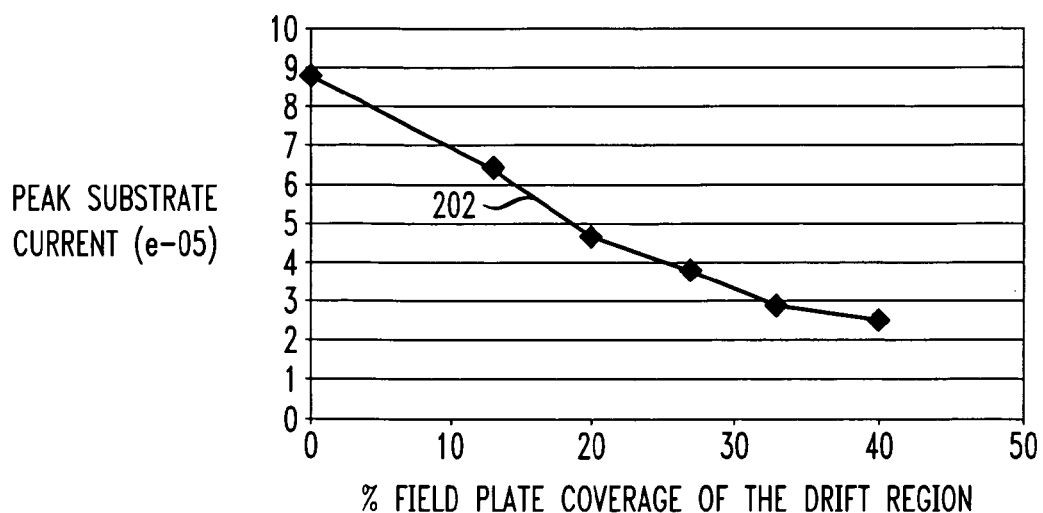
FIGS. 2-6 are graphical views illustrating certain experimental electrical performance measurements corresponding to exemplary LDMOS devices, formed in accordance with embodiments of the present invention, each of the embodiments being substantially similar to the LDMOS device shown in FIG. 1, except for a variation in a percentage of dummy gate field plate coverage of a drift region in the respective devices.

With reference to FIG. 2, there is shown a graphical representation 202 depicting initial (e.g., unstressed) peak substrate current (in amperes) as a function of the percentage of DGFP coverage of the drift region in a corresponding LDMOS device. As apparent from the figure, peak substrate current decreases substantially as the percentage of DGFP coverage of the drift region increases. For an LDMOS device having no (zero percent) DGFP coverage of the drift region, the peak substrate current was measured to be about 88 microamperes (μA). For a DGFP coverage of 13%, the peak substrate current was measured to be about 65 μA. For a 20% DGFP coverage, the peak substrate current was about 47 μA. For a DGFP coverage of 27%, the peak substrate current was about 38 μA. For a DGFP coverage of 33%, the peak substrate current was about 28 μA, and for a DGFP coverage of 40%, the peak substrate current was about 25 μA. With most critical variables (e.g., temperature, drain current, drain-to-source voltage, etc.) associated with the LDMOS devices held substantially constant except for the percentage of DGFP coverage of the drift region, the measured differences in peak substrate current in the respective devices becomes an accurate indicator of HCI degradation in the devices.

Figure 3:
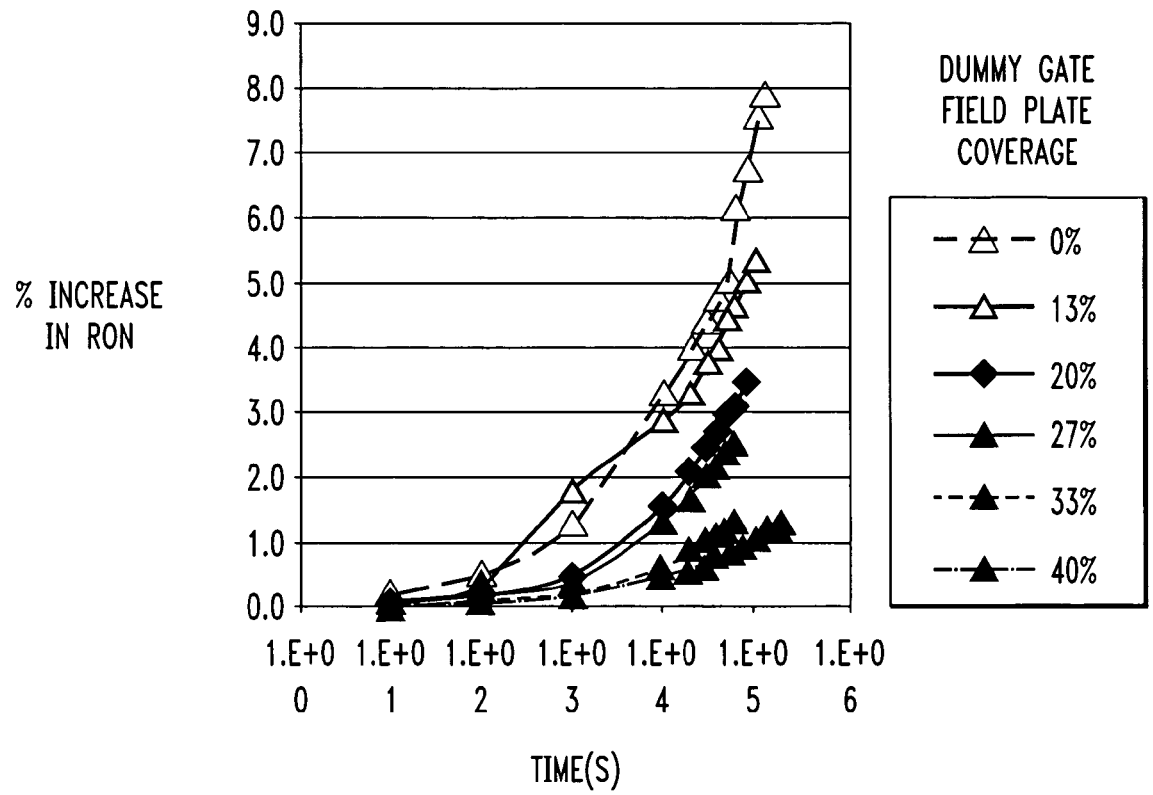

FIG. 3 illustrates the measured increase in on-resistance, Ron, as a function of stress time (in seconds) for each of the respective exemplary LDMOS devices. As apparent from the figure, the LDMOS device with no DGFP coverage (zero percent) of the drift region possessed the highest percentage increase in on-resistance, about 8 percent after a stress of about 100,000 seconds. For the remaining LDMOS devices, the percentage increase in on-resistance decreased with an increasing percentage of DGFP coverage of the drift region. The smallest increase in on-resistance, about one percent after a stress of about 100,000 seconds, was obtained from the LDMOS device having the largest percentage (40%) of DGFP coverage of the drift region.

Figure 4:
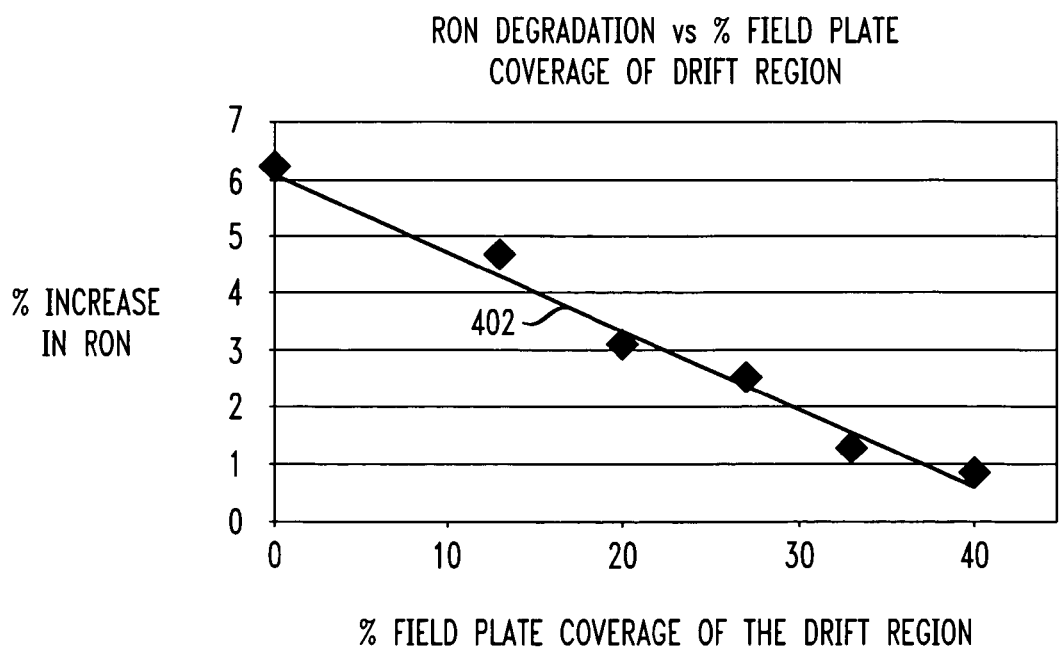

FIG. 4 is a graphical representation 402 depicting on-resistance degradation, determined as a measured percentage increase in on-resistance for a given LDMOS device, as a function of the percentage of DGFP coverage of the drift region in the device after a stress of 60,000 seconds. From the figure, it becomes evident that there is a direct correlation between the percentage increase in on-resistance and the percentage of DGFP coverage of the drift region in an LDMOS device. The relationship between the increase in on-resistance and the percentage of DGFP coverage in the drift region is shown to be substantially linear, at least for percentages of coverage between zero and about 40%. Based on exemplary experimental results, an approximate dependence between the increase in on-resistance and the percentage of DGFP coverage of the drift region in an LDMOS device can be established by the following expression:

$$\% \text{ Increase in Ron} = a \cdot (\% \; DGFP \; \text{Coverage}) + b,$$

where, for the illustrative embodiments described herein, a is equal to about −0.136 and b is equal to about 6.06 for a DGFP coverage range from zero to about 40%. It is to be appreciated that the invention is not limited to any particular values for parameters a and b.

The values of parameters a and b in the above expression are preferably based on certain design characteristics associated with the LDMOS device. For instance, in the above expression, parameter a, which essentially establishes a slope of the graphical representation 402, may be affected by one or more factors of the LDMOS device, including, but not limited to, oxide thickness under the DGFP, the shape of the DGFP, and, to some extent, a temperature dependence of the device. Likewise, parameter b, which essentially establishes an intercept point of the graph 402 when DGFP coverage is zero, is primarily dependent upon one or more process factors associated with the LDMOS device, such as, for example, oxide charge.

Figure 5:
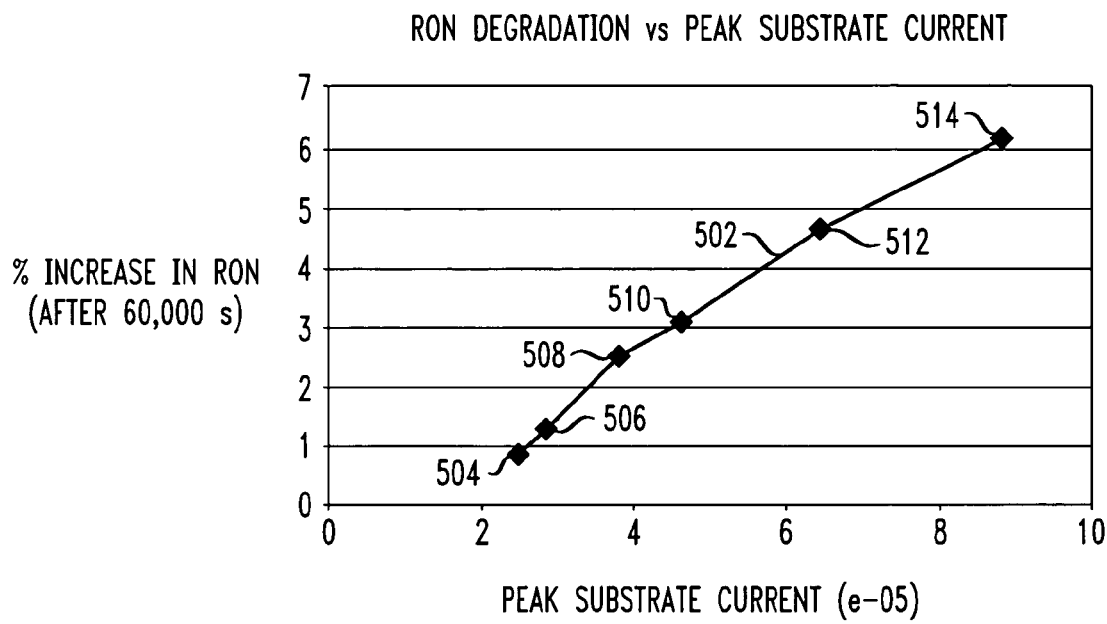

With reference to FIG. 5, an exemplary graphical representation 502 is shown illustrating the relationship between on-resistance degradation, determined as a measured percentage increase in the on-resistance of a given LDMOS device, and initial (e.g., unstressed) peak substrate current in the device after 60,000 seconds. Each of the data points, namely, points 504, 506, 508, 510, 512 and 514, was obtained from the experimental data depicted in FIG. 2 and corresponds to DGFP coverages of 40%, 33%, 27%, 20%, 13% and 0%, respectively. As apparent from the figure, peak substrate current may be used as an indicator to predict the on-resistance degradation for an LDMOS device having a known percentage of DGFP coverage of the drift region in the device. Peak substrate current measurements may therefore be employed to screen devices for on-resistance degradation.

It is to be understood that an LDMOS device generally does not provide separate access to the body region (e.g., via a separate body contact) for measuring substrate current in the device, since the body region is typically internally electrically connected to the source region. Therefore, a given wafer may include a relatively small area test structure, which may be similar to the LDMOS device shown in FIG. 1, in order to facilitate measurement of the substrate current. As shown in FIG. 5, the substrate current measurement can provide an accurate prediction of on-resistance degradation, and thus HCI performance, of one or more LDMOS devices formed on the wafer with the test structure.

Substrate current is related to a particular design of the DGFP. Once the DGFP design has been established, with process parameters kept substantially constant, if the DGFP coverage of the drift region is varied (increased or decreased), the substrate current will change accordingly.

Figure 6:
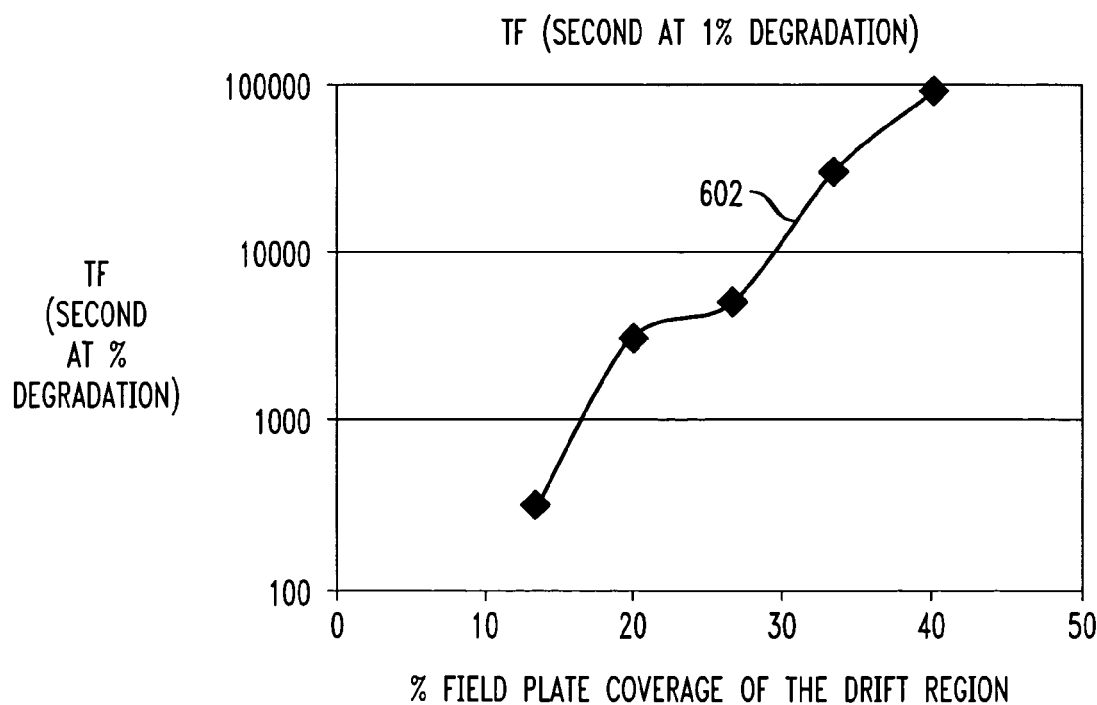

Another way to measure an effectiveness of the DGFP is shown in FIG. 6, which illustrates an exemplary graphical relationship 602 between a lifetime (TF) of the various LDMOS devices, determined as a number of seconds until a one percent increase in on-resistance is measured, and the percentage of DGFP coverage of the drift region in the respective devices. As apparent from the figure, the measured lifetime of an LDMOS device increases by a factor of about 500 by increasing the DGFP coverage from 13% to 40%.

From the experimental results described above in connection with FIGS. 2-6, it can be shown that the percentage of on-resistance degradation in an LDMOS device is directly related to the amount of DGFP coverage of the drift region in the device. The higher the percentage of DGFP coverage, the less is the percentage increase in on-resistance, thus establishing a methodology for controlling HCI degradation in the LDMOS device. This implication is significant in that it demonstrates that the primary region of degradation in an LDMOS device is the drift region, and not the channel region as traditionally believed. The experimental results also indicate that the degradation in on-resistance in an LDMOS device is directly related to the peak substrate current measured before any stress is applied to the device.

The exemplary LDMOS device of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide semiconductor (MOS) device, comprising:
a semiconductor layer of a first conductivity type;
first and second source/drain regions of a second conductivity type formed in the semiconductor layer proximate an upper surface of the semiconductor layer, the first and second source/drain regions being spaced apart relative to one another;
a drift region formed in the semiconductor layer proximate the upper surface of the semiconductor layer and at least partially between the first and second source/drain regions;
an insulating layer formed on at least a portion of the upper surface of the semiconductor layer and above at least a portion of the drift region;
a gate formed on the insulating layer and at least partially between the first and second source/drain regions; and
a shielding structure formed on the insulating layer above at least a portion of the drift region, the shielding structure having an amount of coverage over an upper surface of the drift region configured to produce a peak substrate current in the MOS device less than about 70 microamperes while maintaining a breakdown voltage in the device greater than about 75 volts, such that an amount of hot carrier injection degradation in the MOS device is controlled as a function of the amount of coverage of the shielding structure over the upper surface of the drift region;
wherein the shielding structure is spaced laterally from the gate and is configured to overlap at least an edge of the gate.

2. The device of claim 1, wherein a first portion of the insulating layer under the gate has a different thicknesses in comparison to a second portion of the insulating layer under the shielding structure.

3. The device of claim 1, wherein the shielding structure is electrically connected to the first source/drain region.

4. The device of claim 1, wherein the first source/drain region is a source region and the second source/drain region is a drain region.

5. The device of claim 1, wherein the device comprises a diffused MOS (DMOS) device.

6. The device of claim 5, wherein the device comprises a lateral DMOS device.

7. The device of claim 1, wherein the amount of coverage of the shielding structure over the drift region is at least about 10 percent of the upper surface of the drift region.

8. The device of claim 1, wherein the amount of coverage of the shielding structure over the drift region is in a range from about 10 percent to about 40 percent of the upper surface of the drift region.

9. The device of claim 1, wherein the shielding structure is electrically connected to the source region by a conductive trace, the conductive trace being spaced substantially from the gate by a portion of the insulating layer formed between the gate and the conductive trace.

10. The device of claim 9, wherein the conductive trace is formed using a metallization process.

11. A metal-oxide semiconductor (MOS) device, comprising:
a semiconductor layer of a first conductivity type;
first and second source/drain regions of a second conductivity type formed in the semiconductor layer proximate an upper surface of the semiconductor layer, the first and second source/drain regions being spaced apart relative to one another;
a drift region formed in the semiconductor layer proximate the upper surface of the semiconductor layer and at least partially between the first and second source/drain regions;
an insulating layer formed on at least a portion of the upper surface of the semiconductor layer;
a gate formed on the insulating layer and at least partially between the first and second source/drain regions; and
a shielding structure formed on the insulating layer above at least a portion of the drift region, the shielding structure being configured to cover at least ten percent of an upper surface of the drift region while maintaining a prescribed minimum breakdown voltage in the device;
wherein the shielding structure is spaced laterally from the gate and is configured to overlap at least an edge of the gate.

12. The device of claim 11, wherein an amount of coverage of the shielding structure over the drift region is in a range from about 10 percent to about 40 percent of the upper surface of the drift region.

13. An integrated circuit including at least one metal-oxide semiconductor (MOS) device, the at least one MOS device comprising:
   a semiconductor layer of a first conductivity type;
   first and second source/drain regions of a second conductivity type formed in the semiconductor layer proximate an upper surface of the semiconductor layer, the first and second source/drain regions being spaced apart relative to one another;
   a drift region formed in the semiconductor layer proximate the upper surface of the semiconductor layer and at least partially between the first and second source/drain regions;
   an insulating layer formed on at least a portion of the upper surface of the semiconductor layer and above at least a portion of the drift region;
   a gate formed on the insulating layer and at least partially between the first and second source/drain regions; and
   a shielding structure formed on the insulating layer above at least a portion of the drift region, the shielding structure having an amount of coverage over an upper surface of the drift region configured to produce a peak substrate current in the MOS device less than about 70 microamperes while maintaining a breakdown voltage in the device greater than about 75 volts, such that an amount of hot carrier injection degradation in the MOS device is controlled as a function of the amount of coverage of the shielding structure over the upper surface of the drift region;
   wherein the shielding structure is spaced laterally from the gate and is configured to overlap at least an edge of the gate.

14. The device of claim 13, wherein the prescribed minimum breakdown voltage in the device is about 75 volts.

15. A metal-oxide semiconductor (MOS) device, comprising:
   a semiconductor layer of a first conductivity type;
   first and second source/drain regions of a second conductivity type formed in the semiconductor layer proximate an upper surface of the semiconductor layer, the first and second source/drain regions being spaced apart relative to one another;
   a drift region formed in the semiconductor layer proximate the upper surface of the semiconductor layer and at least partially between the first and second source/drain regions;
   an insulating layer formed on at least a portion of the upper surface of the semiconductor layer and above at least a portion of the drift region;
   a gate formed on the insulating layer and at least partially between the first and second source/drain regions; and
   a shielding structure formed on the insulating layer above at least a portion of the drift region, the shielding structure having an amount of coverage over an upper surface of the drift region configured to produce a percentage increase in on-resistance in the MOS device, while maintaining a breakdown voltage in the device greater than about 75 volts, according to an expression:

$$\% \text{ Increase in } R_{ON} = a \cdot (\% \text{ Shielding Structure Coverage}) + b,$$

where % Increase in $R_{ON}$ is the percentage increase in on-resistance in the device, % Shielding Structure Coverage is the amount of coverage of the shielding structure over the upper surface of the drift region, a is a first prescribed parameter relating to at least one physical factor of the device, and b is a second prescribed parameter relating to at least one process factor used to form the device, whereby an amount of hot carrier injection degradation in the device is controlled as a function of the amount of coverage of the shielding structure over the upper surface of the drift region;
   wherein the shielding structure is spaced laterally from the gate and is configured to overlap at least an edge of the gate.

16. The device of claim 15, wherein the amount of coverage of the shielding structure is configured over the upper surface of the drift region is configured to produce an increase in on-resistance in the device which is in a range from about 0.8 percent to about 4.8 percent.

* * * * *